(12) United States Patent
Bauer

(10) Patent No.: US 11,543,436 B2
(45) Date of Patent: Jan. 3, 2023

(54) CONSTRUCTIVE SYSTEM REGARDING A CAPACITIVE SENSOR

(71) Applicant: G & W ELECTRIC COMPANY, Bolingbrook, IL (US)

(72) Inventor: Alberto Bauer, Dubai (AE)

(73) Assignee: G & W ELECTRIC COMPANY, Bolingbrook, IL (US)

(*) Notice: Subject to any disclaimer, the term of this patent is extended or adjusted under 35 U.S.C. 154(b) by 0 days.

(21) Appl. No.: 17/031,021

(22) Filed: Sep. 24, 2020

(65) Prior Publication Data

US 2021/0018537 A1 Jan. 21, 2021

Related U.S. Application Data

(63) Continuation of application No. PCT/IT2019/000023, filed on Mar. 19, 2019.

(30) Foreign Application Priority Data

Mar. 30, 2018 (IT) .................. 102018000004114

(51) Int. Cl.
*G01R 15/16* (2006.01)
*G01R 19/00* (2006.01)
*G01R 15/14* (2006.01)

(52) U.S. Cl.
CPC .......... *G01R 15/16* (2013.01); *G01R 15/165* (2013.01); *G01R 19/0084* (2013.01); *G01R 15/142* (2013.01)

(58) Field of Classification Search
CPC ............ G01R 19/00; G01R 19/0084; G01R 19/0092; G01R 15/00; G01R 15/04;
(Continued)

(56) References Cited

U.S. PATENT DOCUMENTS 3,396,339 A    8/1968   Miram
3,835,353 A *   9/1974   Hermstein ............. G01R 15/16
                                                                    361/328
(Continued)

FOREIGN PATENT DOCUMENTS

DE       2149881 A1    2/1973
DE     19613688 A1   10/1997
(Continued)

OTHER PUBLICATIONS

International Preliminary Report on Patentability for Application No. PCT/IT2019/000023 dated Oct. 15, 2020 (7 pages).
(Continued)

*Primary Examiner* — Hoai-An D. Nguyen
(74) *Attorney, Agent, or Firm* — Michael Best & Friedrich LLP

(57) ABSTRACT

A capacitive voltage sensor assembly includes a first electrode extending along a longitudinal axis, the first electrode including a first end and a second end opposite the first end, a second electrode surrounding the second end of the first electrode, the second electrode including a tubular portion having a first end and a second end opposite the first end, and a base portion coupled to the first end of the tubular portion, and a mass of dielectric insulating material at least partially encapsulating the first electrode and the second electrode. The tubular portion includes a plurality of cantilevered tabs interconnected at the first end of the second electrode. Each tab of the plurality of cantilevered tabs is circumferentially separated from an adjacent tab of the plurality of cantilevered tabs to define a gap therebetween at the second end of the second electrode.

20 Claims, 5 Drawing Sheets

(58) Field of Classification Search
CPC ........ G01R 15/06; G01R 15/12; G01R 15/14; G01R 15/142; G01R 15/144; G01R 15/146; G01R 15/16; G01R 15/165; G01R 27/00; G01R 27/02; G01R 27/08
USPC ...... 324/76.11, 126, 522, 713; 702/1, 57, 64
See application file for complete search history.

(56) References Cited

U.S. PATENT DOCUMENTS

| | | | |
|---|---|---|---|
| 4,241,373 A * | 12/1980 | Mara | G01R 15/142 324/133 |
| 4,268,889 A * | 5/1981 | Wolfendale | G01D 5/2412 361/278 |
| 4,700,123 A | 10/1987 | Beling | |
| 5,136,241 A | 8/1992 | Blank et al. | |
| 5,661,240 A | 8/1997 | Kemp | |
| 5,991,177 A | 11/1999 | Kaczkowski | |
| 6,252,388 B1 | 6/2001 | Jaeger et al. | |
| 6,307,385 B1 | 10/2001 | Tardif et al. | |
| 7,466,146 B2 | 12/2008 | Stewart et al. | |
| 7,541,816 B1 | 6/2009 | Liao et al. | |
| 7,595,648 B2 | 9/2009 | Ungaretti et al. | |
| 8,242,840 B2 | 8/2012 | Van Veldhoven | |
| 8,283,934 B2 | 10/2012 | Nishizono | |
| 8,294,477 B2 | 10/2012 | Handshoe et al. | |
| 8,446,157 B2 | 5/2013 | Fröjd | |
| 9,291,651 B2 | 3/2016 | Bauer | |
| 9,389,246 B2 | 7/2016 | Juds et al. | |
| 9,568,506 B2 | 2/2017 | Fujinoki | |
| 9,696,348 B2 | 7/2017 | Juds et al. | |
| 9,739,807 B2 | 8/2017 | Barba Jimenez | |
| 9,739,816 B2 | 8/2017 | Flanagan | |
| 9,739,820 B2 | 8/2017 | Gravermann et al. | |
| 9,742,180 B2 | 8/2017 | Wentzel et al. | |
| 9,846,024 B1 | 12/2017 | Noras | |
| 9,921,246 B2 | 3/2018 | Bauer | |
| 9,958,505 B2 | 5/2018 | Honda | |
| 9,983,032 B1 | 5/2018 | Kraver et al. | |
| 10,025,423 B2 | 7/2018 | Aas et al. | |
| 10,088,963 B2 | 10/2018 | Otagaki et al. | |
| 10,203,814 B2 | 2/2019 | Ryynanen et al. | |
| 10,215,778 B2 | 2/2019 | Gravermann et al. | |
| 10,317,442 B2 | 6/2019 | Kawaguchi et al. | |
| 10,338,103 B2 | 7/2019 | Gravermann et al. | |
| 10,345,340 B2 | 7/2019 | Gravermann et al. | |
| 10,425,079 B1 | 9/2019 | Bytheway | |
| 10,591,523 B2 | 3/2020 | Pak et al. | |
| 10,753,962 B2 | 8/2020 | Testa et al. | |
| 10,790,822 B2 | 9/2020 | Wendt et al. | |
| 11,048,367 B2 | 6/2021 | Reynolds et al. | |
| 11,287,456 B2 | 3/2022 | Wang et al. | |
| 11,378,594 B2 | 7/2022 | Djogo | |
| 11,415,611 B2 | 8/2022 | Zhang et al. | |
| 2001/0048308 A1 | 12/2001 | Potter et al. | |
| 2005/0122118 A1 | 6/2005 | Zank et al. | |
| 2006/0033508 A1* | 2/2006 | Lee | H03F 1/34 324/678 |
| 2006/0119369 A1* | 6/2006 | Kawahata | G06V 40/1306 324/662 |
| 2006/0238233 A1 | 10/2006 | Kraus | |
| 2007/0086130 A1 | 4/2007 | Sorensen | |
| 2008/0011093 A1 | 1/2008 | Shank et al. | |
| 2010/0107775 A1 | 5/2010 | Wang et al. | |
| 2010/0283487 A1 | 11/2010 | Juds et al. | |
| 2010/0318306 A1 | 12/2010 | Tierney et al. | |
| 2011/0012623 A1 | 1/2011 | Gastel et al. | |
| 2011/0121820 A1* | 5/2011 | Handshoe | G01R 15/16 361/301.3 |
| 2011/0204879 A1 | 8/2011 | Peretto | |
| 2011/0221452 A1 | 9/2011 | Shyue | |
| 2012/0261384 A1* | 10/2012 | LaBianco | H01H 33/027 200/48 R |
| 2012/0326734 A1 | 12/2012 | Cho et al. | |
| 2013/0043891 A1 | 2/2013 | Handshoe et al. | |
| 2014/0300374 A1* | 10/2014 | McKenzie | G01R 15/16 324/658 |
| 2014/0354302 A1 | 12/2014 | Lu et al. | |
| 2014/0370741 A1 | 12/2014 | Bolcato et al. | |
| 2015/0279642 A1 | 10/2015 | Prance | |
| 2015/0346907 A1 | 12/2015 | Nakajima et al. | |
| 2016/0061864 A1 | 3/2016 | White et al. | |
| 2016/0103174 A1 | 4/2016 | Aaltonen et al. | |
| 2016/0139181 A1 | 5/2016 | Gravermann et al. | |
| 2016/0202286 A1 | 7/2016 | Aaltonen et al. | |
| 2017/0030946 A1 | 2/2017 | Gravermann et al. | |
| 2017/0038414 A1 | 2/2017 | Barba Jimenez | |
| 2017/0061187 A1 | 3/2017 | Wen | |
| 2017/0067939 A1 | 3/2017 | Imai et al. | |
| 2017/0184634 A1 | 6/2017 | Wentzel | |
| 2017/0234908 A1 | 8/2017 | Gravermann et al. | |
| 2017/0250499 A1 | 8/2017 | Sica et al. | |
| 2017/0276723 A1 | 9/2017 | Buffa et al. | |
| 2017/0363660 A1 | 12/2017 | Gravermann | |
| 2018/0092557 A1 | 4/2018 | Bickford et al. | |
| 2018/0100878 A1 | 4/2018 | Pearce et al. | |
| 2018/0292435 A1 | 10/2018 | Wentzel et al. | |
| 2018/0374644 A1 | 12/2018 | Stollwerck et al. | |
| 2019/0146006 A1 | 5/2019 | Sanchez Ruiz et al. | |
| 2019/0181860 A1 | 6/2019 | Cholasta | |
| 2019/0234995 A1 | 8/2019 | Peretto | |
| 2019/0237260 A1 | 8/2019 | Stollwerck et al. | |
| 2019/0324073 A1 | 10/2019 | Mikami | |
| 2020/0064376 A1 | 2/2020 | Loyd et al. | |
| 2020/0124642 A1 | 4/2020 | Djogo | |
| 2020/0158762 A1 | 5/2020 | Wilson et al. | |
| 2020/0200936 A1 | 6/2020 | Kruger | |
| 2020/0256896 A1 | 8/2020 | Bauer et al. | |
| 2021/0072289 A1 | 3/2021 | Peretto et al. | |
| 2021/0206418 A1 | 7/2021 | Nakano et al. | |
| 2021/0302478 A1 | 9/2021 | Kapoor et al. | |
| 2021/0356499 A1 | 11/2021 | Ferraro et al. | |
| 2021/0359533 A1 | 11/2021 | Hatano | |
| 2022/0065910 A1 | 3/2022 | Ellis, Jr. et al. | |
| 2022/0123748 A1 | 4/2022 | Willis et al. | |
| 2022/0311441 A1 | 9/2022 | Liu | |
| 2022/0317158 A1 | 10/2022 | Stollwerck et al. | |

FOREIGN PATENT DOCUMENTS

| | | |
|---|---|---|
| DE | 102017000723 A1 | 8/2018 |
| EP | 0677747 A2 | 10/1995 |
| EP | 0912902 A1 | 5/1999 |
| EP | 2366108 B1 | 8/2012 |
| EP | 2993480 A1 | 3/2016 |
| EP | 3828553 A1 | 6/2021 |
| EP | 3840135 A1 | 6/2021 |
| EP | 3862760 A1 | 8/2021 |
| EP | 3913379 A1 | 11/2021 |
| EP | 3881085 A4 | 7/2022 |
| EP | 4058815 A1 | 9/2022 |
| ES | 2221551 A1 | 12/2004 |
| GB | 967853 A | 8/1964 |
| GB | 2203557 A | 10/1988 |
| WO | 2010070693 A1 | 6/2010 |
| WO | 2011125725 A1 | 10/2011 |
| WO | 201157047 A8 | 1/2013 |
| WO | 2013026423 A1 | 2/2013 |
| WO | 2016109009 A1 | 7/2016 |
| WO | 2017050039 A1 | 3/2017 |
| WO | 2017050042 A1 | 3/2017 |
| WO | 2017050044 A1 | 3/2017 |
| WO | 2017050045 A1 | 3/2017 |
| WO | 2017050058 A1 | 3/2017 |
| WO | 2018069949 A2 | 4/2018 |
| WO | 2018096567 A2 | 5/2018 |
| WO | 2018114661 A1 | 6/2018 |
| WO | 2019073497 A1 | 4/2019 |
| WO | 2020109283 A2 | 6/2020 |
| WO | 2020131903 A1 | 6/2020 |
| WO | 2020131909 A1 | 6/2020 |
| WO | 2021180642 A1 | 9/2021 |
| WO | 2022069967 A1 | 4/2022 |

(56) References Cited

FOREIGN PATENT DOCUMENTS

| WO | 2022072130 A1 | 4/2022 |
|----|---------------|--------|
| WO | 2022094645 A1 | 5/2022 |
| WO | 2022124942 A1 | 6/2022 |

OTHER PUBLICATIONS

International Search Report and Written Opinion for Application No. PCT/IT2019/000023 dated Jul. 26, 2019 (9 pages).
International Search Report and Written Opinion for Application No. PCT/US2019/066899 dated Mar. 5, 2020 (10 pages).
International Search Report and Written Opinion and Application No. PCT/US2019/066906 dated Mar. 18, 2020 (7 pages).
International Search Report and Written Opinion for Application No. PCT/US2019/053525 dated Jun. 29, 2020 (12 pages).
International Preliminary Report on Patentability for Application No. PCT/US2019/066899 dated Jul. 1, 2021 (9 pages).
International Preliminary Report on Patentability for Application No. PCT/US2019/066906 dated Jul. 1, 2021 (7 pages).

* cited by examiner

CONSTRUCTIVE SYSTEM REGARDING A CAPACITIVE SENSOR

CROSS-REFERENCE TO RELATED APPLICATIONS

This application is a continuation of co-pending International Application No. PCT/IT2019/000023, filed on Mar. 19, 2019, which claims priority to Italian Patent Application No. 102018000004114, filed Mar. 30, 2018, the entire contents of both of which are incorporated herein by reference.

FIELD OF THE INVENTION

The present invention relates to a constructive system regarding a capacitive voltage sensor, wherein said sensor is able to detect the electric field generated by a voltage element of the same capacitive sensor, in order, for example, to be able to estimate the value of the voltage of said live element.

More particularly, the present invention relates to a constructive system regarding a capacitive voltage sensor, wherein said sensor provides for detecting the electric field generated by the voltage element of the same sensor without undergoing the influence of any surrounding electric and/or magnetic fields, such as, for example, electro/magnetic fields generated by other conductors and/or other bars arranged nearby.

BACKGROUND

Currently the current capacitive voltage sensors have a series of drawbacks.

A first drawback is due to the fact that the resin dielectric material arranged around the components of the sensor includes vacuoles (air bubbles) with consequent phenomena of undesired partial discharges.

A second drawback is due to the fact that the same resin is detached with respect to the elements that make up the capacitive sensor with consequent phenomena of undesired partial discharges.

A third drawback is due to the fact that the aforementioned resin is not perfectly adherent and/or not perfectly clinging and/or constrained with respect to the elements making up the capacitive sensor and, therefore, as a result of aging, detachments take place between said resin and the aforementioned elements, with consequent phenomena of unwanted partial discharges. This drawback is particularly present when the capacitive sensor is used in an environment where the operating temperature (hot/cold) varies cyclically.

A fourth drawback is due to the fact that the components that make up the sensors are expensive to make.

A fifth drawback is due to the fact that the components that form the sensors after their correct positioning can move during the subsequent assembly or transport operations that take place before the resin is poured, with consequent realization of a non-conforming product and/or of a product to be discarded.

SUMMARY

The invention provides, in one aspect, a capacitive voltage sensor assembly including a first electrode extending along a longitudinal axis, the first electrode including a first end and a second end opposite the first end, a second electrode surrounding the second end of the first electrode, the second electrode including a tubular portion having a first end and a second end opposite the first end, and a base portion coupled to the first end of the tubular portion, and a mass of dielectric insulating material at least partially encapsulating the first electrode and the second electrode. The tubular portion includes a plurality of cantilevered tabs interconnected at the first end of the second electrode. Each tab of the plurality of cantilevered tabs is circumferentially separated from an adjacent tab of the plurality of cantilevered tabs to define a gap therebetween at the second end of the second electrode.

The invention provides, in another aspect, a capacitive voltage sensor assembly including a first electrode extending along a longitudinal axis, the first electrode including a first end and a second end opposite the first end, a second electrode surrounding the second end of the first electrode, the second electrode including a tubular portion having a first end and a second end opposite the first end, and a mass of dielectric insulating material at least partially encapsulating the first electrode and the second electrode. The tubular portion includes a plurality of cantilevered tabs interconnected at the first end of the second electrode. Each tab of the plurality of cantilevered tabs is circumferentially separated from an adjacent tab of the plurality of cantilevered tabs to define a gap therebetween at the second end of the second electrode. The plurality of cantilevered tabs is configured to flex during curing of the mass of dielectric insulating material.

The invention provides, in another aspect, a capacitive voltage sensor assembly including a first electrode extending along a longitudinal axis, a second electrode including a tubular portion arranged coaxially with the longitudinal axis and a base portion located at an end of the tubular portion, the base portion extending transverse to the longitudinal axis, and a mass of dielectric insulating material at least partially encapsulating the first electrode and the second electrode. The tubular portion and the base portion each include a plurality of through holes, and the tubular portion is configured to flex during curing of the mass of dielectric insulating material.

Other features and aspects of the invention will become apparent by consideration of the following detailed description and accompanying drawings.

BRIEF DESCRIPTION OF THE DRAWINGS

Further features and advantages of the present invention will be more evident from the following description of some of its preferred practical embodiments, given here purely by way of non-limiting example, made with reference to the figures of the enclosed drawings in which.

DETAILED DESCRIPTION

Figure 1:
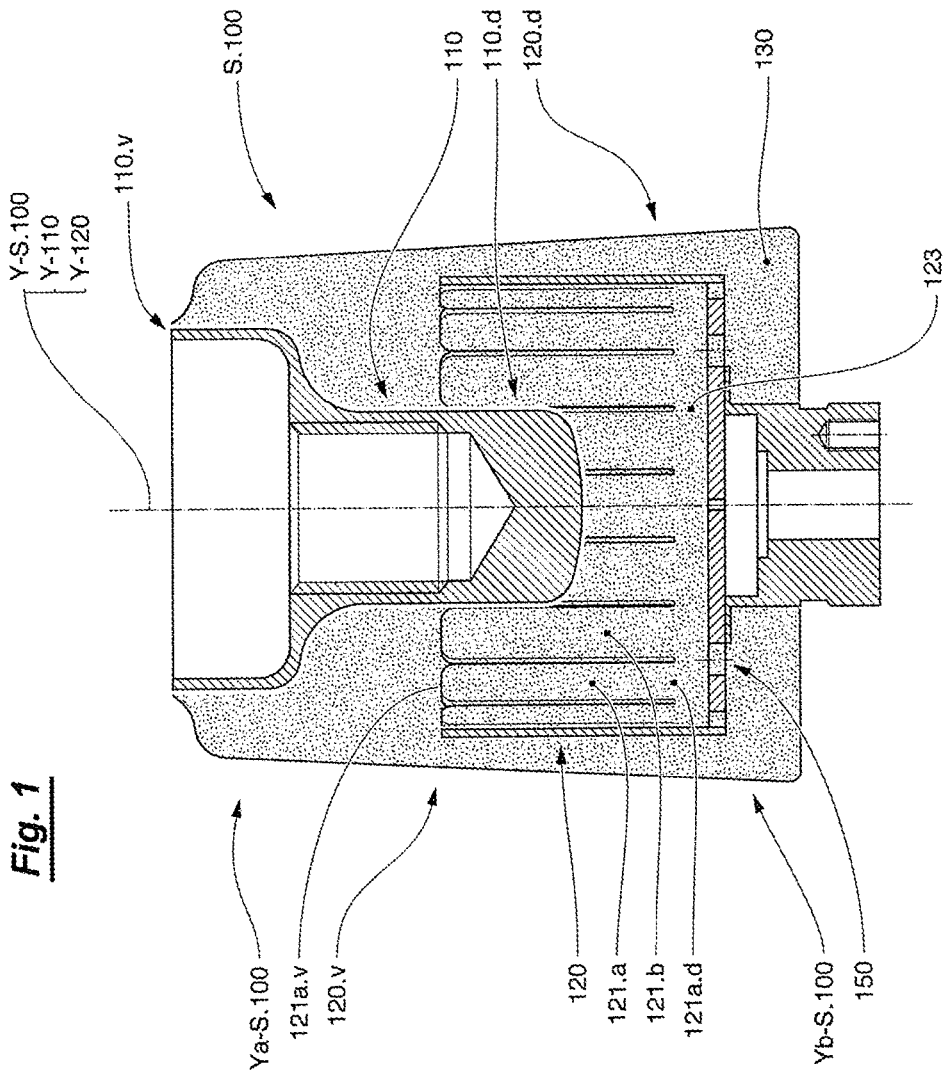
FIG. 1 shows schematically and in axial section a first embodiment of the constructive system object of the present invention.
Figure 3:
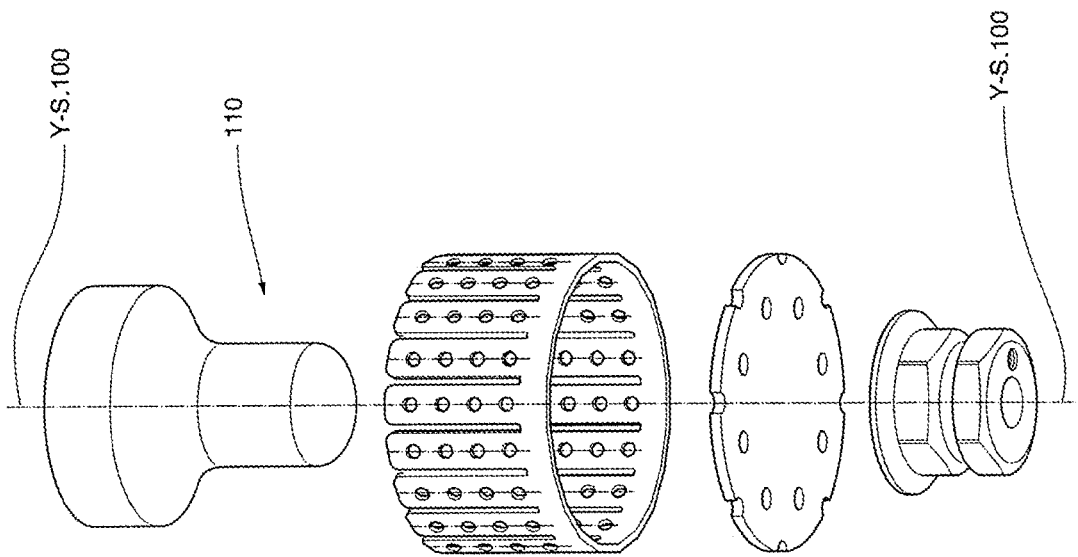
FIG. 3 is an exploded view from the bottom upwards of the components relating to the first embodiment.
Figure 2:
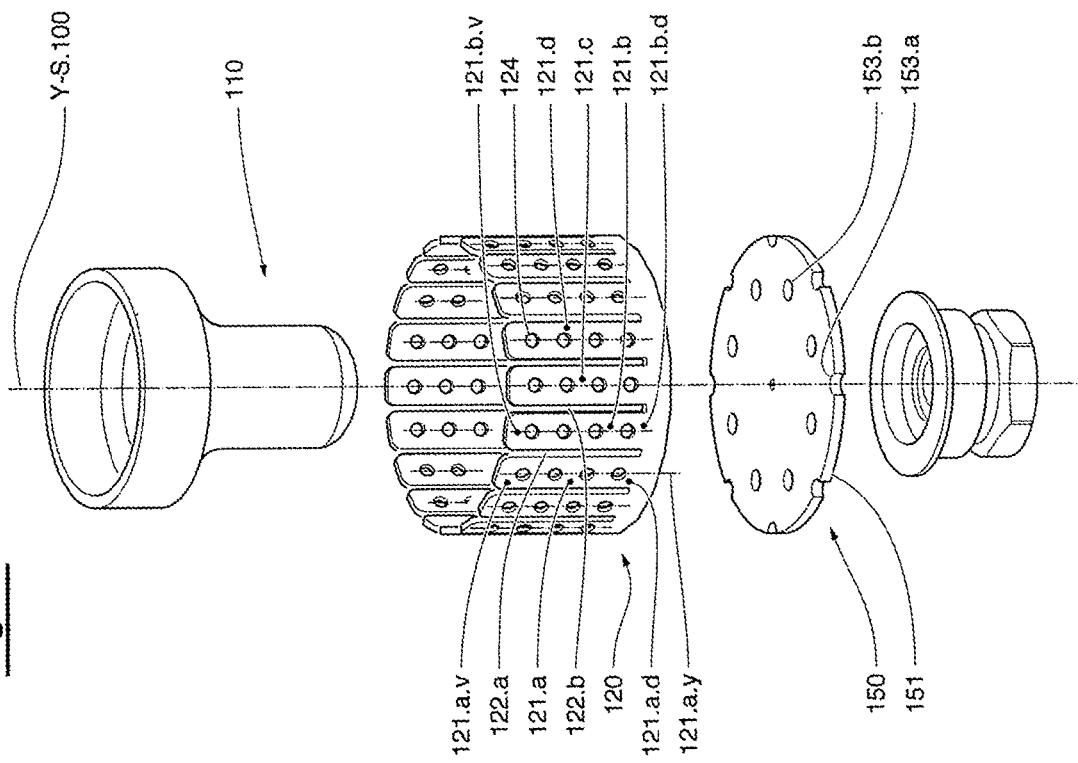
FIG. 2 is an exploded view from above downwards of the components relating to the first embodiment.
Figure 4:
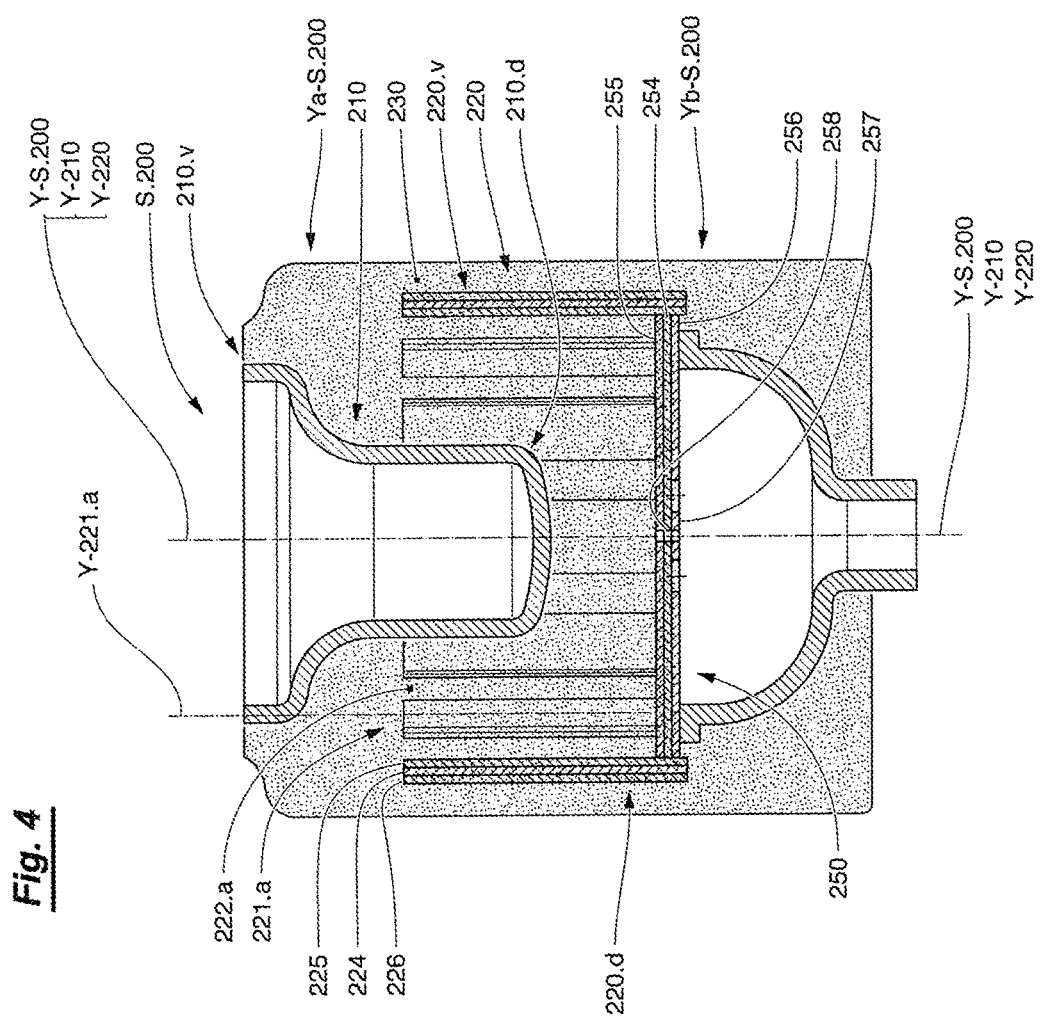
FIG. 4 shows schematically and in axial section a second embodiment of the construction system object of the present invention.
Figure 6:
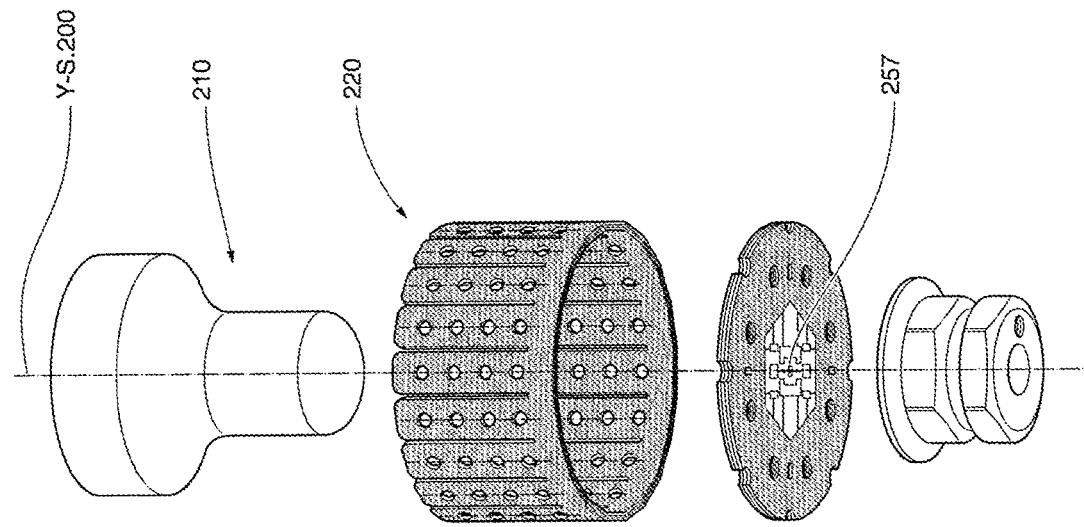
FIG. 6 is an exploded view from the bottom upwards of the components relating to the second embodiment.
Figure 5:
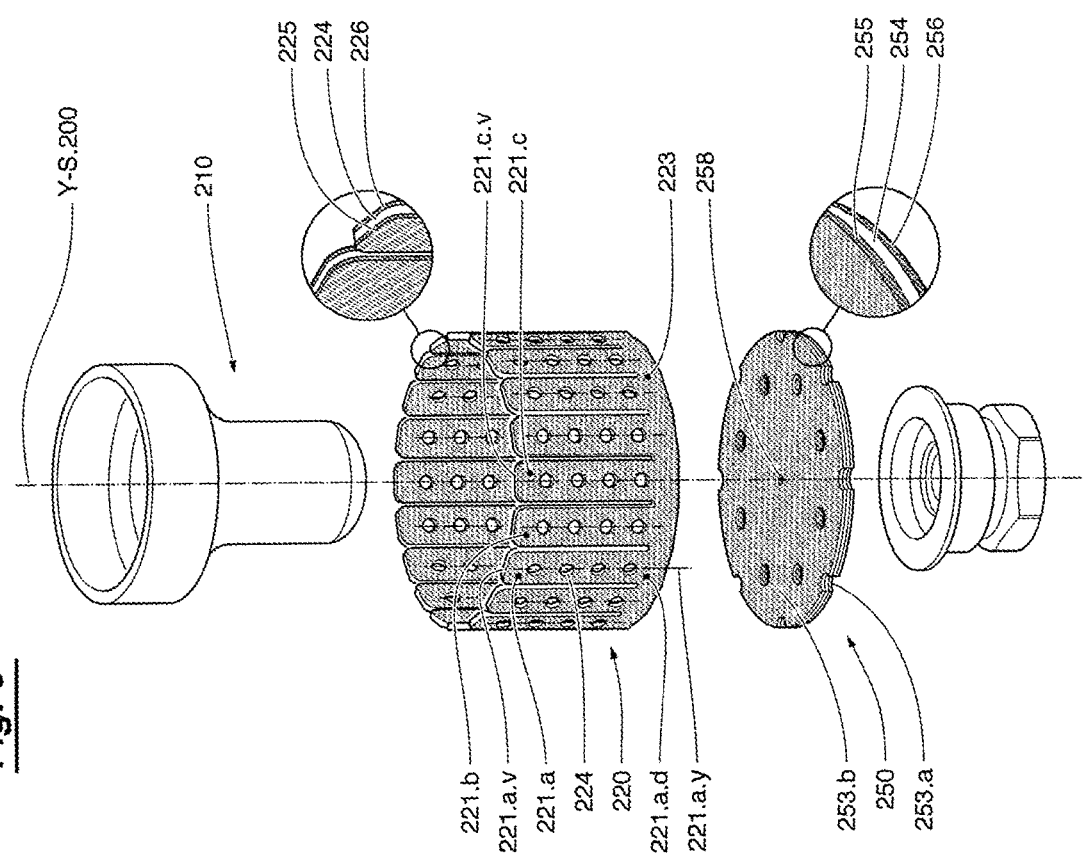
FIG. 5 is an exploded view from above downwards of the components relating to the second embodiment.

With reference to the attached figures, a constructive system according to an embodiment of the present invention concerns a capacitive electric voltage sensor, indicated with S.100 in FIGS. 1, 2 and 3, and with S.200 in FIGS. 4, 5 and 6, in which said system extends axially along an axis Y_S.100/Y_S.200, defined longitudinal, configuring a first axial end portion, Ya_S.100/Ya_S.200, here defined for descriptive reasons as vicinal without limiting intent, and a second axial end portion, Yb_S.100/Yb_S.200, here defined for descriptive reasons as distal without limiting intent, in which said sensor extends transversely along a transverse axis X.

Said system substantially comprises: a first electrode 110/210 (made completely or partially with conductive material as better understood in the following), a second electrode 120/220 (made completely or partially with conductive material as better understood later), and a mass of dielectric insulating material, 130/230.

The first electrode 110/210 is positioned near said first axial end portion Ya_S.100/Ya_S.200 and preferably has an elongated shape which extends axially along its axis Y_110/Y_210 arranged coaxially with respect to the axis Y_S.100/Y_S.200 of the sensor S.100/S.200, in order to configure a first axial portion 110.v/210.v defined vicinal and a second axial portion 110.d/210.d defined distal and opposite with respect to the first axial portion 110.v/210.d.

The second electrode 120/220 has a tubular shape that extends longitudinally along a longitudinal axis thereof Y_120/Y_220 arranged coaxially with respect to the axis of the sensor Y_S.100/Y_S.200 of the sensor S.100/S.200. Said second electrode 120/220 is positioned around said first electrode 110/210, more particularly around the distal portion 110.d/210.d of said first electrode 110/210, and also said second electrode 120/220 configures a first axial portion 120.v/220.v defined vicinal and a second axial portion 120.d/220.d defined distal which is opposite with respect to said first axial portion 120.v/220.v.

With reference to the mass of dielectric insulating material 130/230, it is intended to at least partially enclose said first electrode 110/210 and said second electrode 120/220. The aforementioned first electrode 110/210 preferably has a funnel-like shape, with its distal portion 100.d/210.d lying within the vicinal portion 120.v/220.v of the tubular body defined by the second electrode 120/220.

With particular reference to the second electrode 120/220, it comprises a plurality of first elements, 121a, 121b, 121c, etc./221a/221b, 221c, etc., which have an axially elongated shape intended to define for each of them a vicinal axial end, 121a.v/221a.v, and a distal axial end 121a.d/221a.d.

These first elements 121a, 121b, etc./221a, 221b, etc. are arranged circumferentially side by side with each other, in order to configure a tubular body 120/220 and, again these first elements 121a, 121b, etc./221a/221b, etc. are supported in a cantilevered manner, with their distal ends 121a.d/221a.d joined to each other by means of a circular ring 123/223 which acts as a support foot, so that the respective vicinal ends 121a.v/221b.v are free to oscillate (move) with a certain degree of freedom, in which said degree of freedom has a magnitude such as to allow said elements 121a, 121b, etc./221a, 221b, etc. cantilevered and more particularly supported by said respective vicinal ends 121a.v/221a.v to flex and/or move during the solidification steps of the resin used for forming the sensor, i.e. to follow the thermal extensions and contractions of the same resin during the casting and cooling phases of the same resin.

Again with reference to the attached figures, the system can further comprise a second element 150/250, wherein said second element 150/250 is positioned near the distal ends 121a.d, 121b.d, etc./221a.d, 221b.d, etc. of said plurality of first elements 121a, 121b, etc./221a, 221b, etc., as for example inside the circular ring 123/223 which acts as a support foot.

Preferably, said first elements 121a, 121b, etc./221a/221b, etc. are circumferentially spaced apart, in order to form openings 122a, 122b, etc./222a, 222b, etc., in which said openings have a width such as to allow the resin, in its liquid/pasty state, and therefore during the pouring thereof, to flow between said openings 122a, 122b, etc./222a, 222b, etc. from the outside towards the inside of the tubular body 120/220 as well as from the inside towards the outside of the same tubular body 120/220 and, therefore, allowing to the same resin to perfectly arrange itself around the individual elements. In this context, optionally, said first elements 121a, 121b, etc./221a, 221b, etc. can also be equipped with through holes 124/224. Preferably, said first elements 121a, 121b, etc./221a, 221b, etc. can be laminar elements having an elongated shape which extends along a respective longitudinal axis 121a.y/221a.y, in which the latter axis can be oriented parallel to the longitudinal axis Y_S.100/Y_S.200 of the sensor S. 100/S.200. In this context, this parallelism is a preferred but not a limiting characteristic.

Preferably, the distal ends 121a.d, 121b.d, etc./221a.d, 221b.d, etc. of said first elements 121a, 121b, etc./221a/221b, etc. are associated/constrained to the external perimeter 151/2510f said second element 150/250, and said second element 150/250 is preferably provided with through openings 154a, 153b/253a, 253b, near the external perimeter 151/251 (having a shape in the form of a half-moon) or within said external perimeter 151/251, for the same reasons as previously indicated with respect to the openings 124/224.

With particular reference to the figures, as also better described below, said first electrode 120/220 having a tubular shape and said second element 150/250 having a disc-like shape can form an electrode having the shape of a "glass/cup", in which said first elements 121a, 121b, etc./221a/221b, etc. form the tubular portion of said glass and in which the second element 150/250 forms the bottom portion of the same glass.

With reference to the system illustrated in FIGS. 1, 2 and 3, two different operating configurations can be implemented. To implement the first operating configuration, the first electrode 110 is connected to a voltage potential, such as for example a live bar by a conductive connection, in such a way that said first electrode 110 performs the function of source electrode 110 electric field generator. In this first configuration, the second electrode 120, positioned around said source electrode 110, acts as an electric field sensor electrode 120 and, more particularly, as an electric field sensor electrode 120 able to detect the electric field generated by said source electrode 110, wherein also the second element 150 is present, wherein said second element 150 can also act as an electric field sensor.

To implement the second operating configuration, the second electrode 120 is connected to a voltage potential, such as for example a live bar by a conductive connection, so that said second electrode 120 performs the function of source electrode 120 electric field generator. In this second configuration, the first electrode 110, positioned within said second source electrode 120, acts as an electric field sensor electrode 110 and, more particularly, as an electric field sensor electrode 110 able to detect the electric field generated by said source electrode 120.

With reference to FIGS. 4, 5, 6, 7 and 8, they illustrate a variant embodiment of the system object of the present invention, wherein, optionally, said first elements 221*a*, 221*b*, 221*c*, etc. comprise respective first laminae 224 in insulating material designed to form a self-supporting support structure and respective first thin layers 225 of conductive material applied on the respective inner surfaces of said first laminae 224, wherein the set of the various layers 225 made of conductive material of the various first elements 221*a*, 221*b*, 221*c*, etc. form the second electrode 220_225 having a tubular shape.

Optionally, said first elements 221*a*, 221*b*, 221*c*, etc. may further comprise respective second thin layers 226 of conductive material applied on the outer surface of said first sheets 224, electrically insulated with respect to the first thin layers 225 and preferably connected to ground, in which the set of the various layers 226 form an electromagnetic screen, having tubular form, which is adapted to prevent electric field lines external to the sensor 5_200, such as for example electric field lines generated by conductors arranged nearby, to close on the first internal electrode 210 or on the second electrode 220_225, in such a way that the capacitive coupling between the first electrode 210 and the second electrode 220_225 is immune to the external electric fields.

FIGS. 4, 5, 6, 7 and 8 illustrate a variant embodiment of the system object of the present invention in which said second element 250 comprises a first lamina 254 made of insulating material stretched to form a self-supporting supporting structure and a first thin layer of conductive material 255 applied to the inner surface of said first lamina 254, wherein said first thin layer 255 of conductive material is stretched to form a further component for second electrode 220 of the capacitive sensor S_200, for example electrically connecting said layer inner/upper 255 with the first conductive inner layer 225 of the second electrode 220.

Optionally, said second element 250 may further comprise a second thin layer 256 of conductive material (preferably connected to ground) applied on the outer surface of said first lamina 254 and electrically insulated with respect to the first thin layer 255, stretched to form an electromagnetic shield adapted to prevent to the electric field lines external to the sensor S_200 (such as for example electric field lines generated by conductors arranged nearby) to close on the first internal electrode 210 or on the second electrode 220_225, so that the capacitive coupling between the first central electrode 210 and the second tubular electrode 210_225 is immune to external electric fields.

Figure 7:
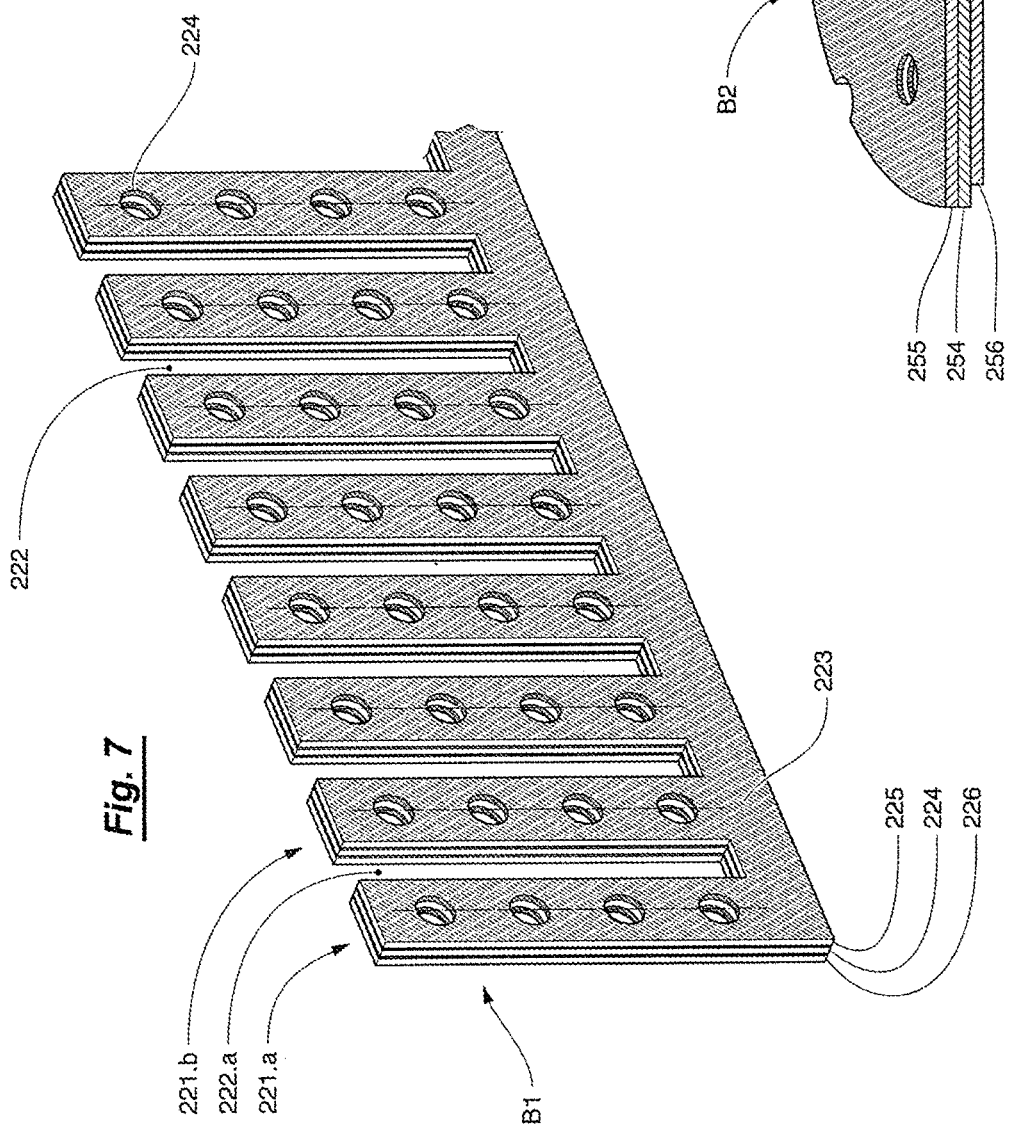
FIG. 7 illustrates schematically a constructive detail of the second embodiment.

With reference to FIG. 7 it illustrates a flat coppered base 81 which can be rolled up, comprising a base 223 and "petals" 221*a*, 221*b*, etc., in which the said base 81 is able to form the second electrode 220 having a tubular shape.

The flat base 81 comprises a first lamina 224 of insulating material intended to form a self-supporting support structure and a first thin layer 225 of conductive material applied on the inner surface of said first lamina 224, in such a way that by wrapping said base in the manner of a ring with the first layer 225 inside the second electrode 220 is obtained.

Optionally, if desirable, said base 81 may also comprise a second thin layer 226 of conductive material applied to the outer surface of said first lamina 224, wherein said second thin layer 226 is electrically insulated with respect to the first thin layer 225, in order to form, throughout the winding in the form of a ring as aforesaid, an electromagnetic shield having a tubular shape in relation to the second electrode 220 as specified above.

Figure 8:
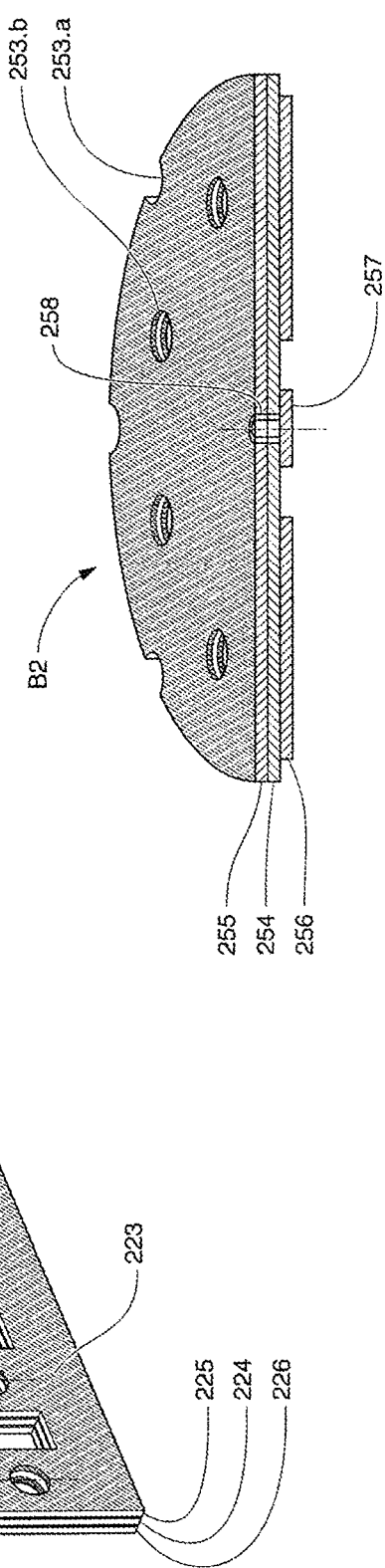
FIG. 8 schematically illustrates a construction detail of the second embodiment.

With reference to FIG. 8, the second element 250 can also be obtained by means of a copper-plated base 82, comprising a first lamina 254 made of insulating material intended to form a self-supporting supporting structure and a first thin layer of conductive material 255 applied to the inner/upper surface of said first lamina 254, in which said first thin layer 255 of conductive material is stretched to form a further component for the second electrode 220 as aforesaid.

Optionally, said second element 250 may further comprise a second thin layer 256 of conductive material applied to the outer/lower surface of said first lamina 254, wherein said second layer 256 is electrically insulated with respect to the first layer 255, as well as a third layer of conductive material 257, applied on the outer/lower face of said lamina 254, electrically isolated with respect to the second layer 256, wherein said third layer 257 is connected by one or more "via" 258 with the first layer of inner and upper conductive material 255.

With reference to the above description the capacitive sensor S_200 can provide a first and a second operative configuration.

With reference to the first operating configuration, said first electrode 210 can act as a source electrode and the second electrode 220, more particularly the inner conductive layer 225 (and also the optional inner conductive layer 255 of the second element 250) can perform the function of an electric field sensor electrode adapted to detect the electric field emitted by the first electrode 210 (225,255).

With reference to the second operating configuration, said second electrode 220, more particularly the inner conductive layer 225 (and also the optional internal conductive layer 255 of the second element 250) can perform the function of an electric field source electrode and said first electrode 210 can act as an electric field sensor electrode able to detect the electric field emitted by the second electrode 220 (i.e. from the layer 225 and/or the layer 255).

The description of the various embodiments of the constructive system for a capacitive sensor is given purely by way of an example without limiting, and therefore all the modifications or variants suggested by the practice and/or falling within the scope of the following claims can be applied to said system. The following claims are also an integrative part for the above description.

What is claimed is:
1. A capacitive voltage sensor assembly comprising:
   a first electrode extending along a longitudinal axis, the first electrode including a first end and a second end opposite the first end;
   a second electrode surrounding the second end of the first electrode, the second electrode including
     a tubular portion having a first end and a second end opposite the first end, and
     a base portion coupled to the first end of the tubular portion; and
   a mass of dielectric insulating material at least partially encapsulating the first electrode and the second electrode,
   wherein the tubular portion includes a plurality of cantilevered tabs interconnected at the first end of the tubular portion, each tab of the plurality of cantilevered tabs circumferentially separated from an adjacent tab of the plurality of cantilevered tabs to define a gap therebetween at the second end of the tubular portion.

2. The capacitive voltage sensor assembly of claim 1, wherein the tubular portion includes an insulating layer, an inner conductive layer disposed on an inner side of the insulating layer, and an outer conductive layer disposed on an outer side of the insulating layer.

3. The capacitive voltage sensor assembly of claim 2, wherein the first electrode is configured to be connected to a source voltage, and wherein the inner conductive layer is configured to form a capacitive coupling with the first electrode.

4. The capacitive voltage sensor assembly of claim 3, wherein the outer conductive layer is configured to shield the capacitive coupling from external electric fields.

5. The capacitive voltage sensor assembly of claim 4, wherein the outer conductive layer is configured to be connected to a ground potential.

6. The capacitive voltage sensor assembly of claim 1, wherein the first electrode has a funnel shape that tapers inwardly from the first end of the first electrode toward the second end of the first electrode.

7. The capacitive voltage sensor assembly of claim 1, wherein each tab of the plurality of cantilevered tabs includes a plurality of through holes.

8. The capacitive voltage sensor assembly of claim 1, wherein the base portion includes a plurality of through holes.

9. The capacitive voltage sensor assembly of claim 1, wherein the base portion includes a plurality of recesses formed in an outer periphery of the base portion.

10. The capacitive voltage sensor assembly of claim 1, wherein each tab of the plurality of cantilevered tabs extends parallel to the longitudinal axis.

11. The capacitive voltage sensor assembly of claim 1, wherein the base portion includes an inner conductive layer facing the first electrode, an outer conductive layer opposite the inner conductive layer, and an insulating layer between the inner layer and the outer layer.

12. The capacitive voltage sensor assembly of claim 1, wherein the base portion is disc shaped.

13. A capacitive voltage sensor assembly comprising:
a first electrode extending along a longitudinal axis, the first electrode including a first end and a second end opposite the first end;
a second electrode surrounding the second end of the first electrode, the second electrode including a tubular portion having a first end and a second end opposite the first end; and
a mass of dielectric insulating material at least partially encapsulating the first electrode and the second electrode,
wherein the tubular portion includes a plurality of cantilevered tabs interconnected at the first end of the tubular portion, each tab of the plurality of cantilevered tabs circumferentially separated from an adjacent tab of the plurality of cantilevered tabs to define a gap therebetween at the second end of the tubular portion, and
wherein the plurality of cantilevered tabs is configured to flex during curing of the mass of dielectric insulating material.

14. The capacitive voltage sensor assembly of claim 13, wherein the tubular portion includes an insulating layer, an inner conductive layer disposed on an inner side of the insulating layer, and an outer conductive layer disposed on an outer side of the insulating layer.

15. The capacitive voltage sensor assembly of claim 14, wherein the first electrode is configured to be connected to a source voltage, wherein the inner conductive layer is configured to form a capacitive coupling with the first electrode, and wherein the outer conductive layer is configured to shield the capacitive coupling from external electric fields.

16. The capacitive voltage sensor assembly of claim 13, wherein the first electrode has a funnel shape that tapers inwardly from the first end of the first electrode toward the second end of the first electrode.

17. The capacitive voltage sensor assembly of claim 13, wherein each tab of the plurality of cantilevered tabs includes a plurality of through holes.

18. The capacitive voltage sensor assembly of claim 13, wherein each tab of the plurality of cantilevered tabs extends parallel to the longitudinal axis.

19. The capacitive voltage sensor assembly of claim 18, wherein the tubular portion is arranged coaxially with the longitudinal axis.

20. A capacitive voltage sensor assembly comprising:
a first electrode extending along a longitudinal axis;
a second electrode including a tubular portion arranged coaxially with the longitudinal axis and a base portion located at an end of the tubular portion, the base portion extending transverse to the longitudinal axis; and
a mass of dielectric insulating material at least partially encapsulating the first electrode and the second electrode,
wherein the tubular portion and the base portion each include a plurality of through holes, and
wherein the tubular portion is configured to flex during curing of the mass of dielectric insulating material.

* * * * *